United States Patent
Lester et al.

(10) Patent No.: US 9,123,853 B2
(45) Date of Patent: Sep. 1, 2015

(54) SERIES CONNECTED SEGMENTED LED

(71) Applicant: Manutius IP, Inc., Los Altos, CA (US)

(72) Inventors: Steven D. Lester, Palo Alto, CA (US); Chih-Wei Chuang, Albany, CA (US)

(73) Assignee: Manutius IP, Inc., Los Altos, CA (US)

( * ) Notice: Subject to any disclaimer, the term of this patent is extended or adjusted under 35 U.S.C. 154(b) by 0 days.

(21) Appl. No.: 13/959,313

(22) Filed: Aug. 5, 2013

(65) Prior Publication Data

US 2013/0313519 A1 Nov. 28, 2013

Related U.S. Application Data

(63) Continuation of application No. 13/292,938, filed on Nov. 9, 2011, now Pat. No. 8,581,267.

(51) Int. Cl.
| | |
|---|---|
| *H01L 29/00* | (2006.01) |
| *H01L 33/08* | (2010.01) |
| *H01L 27/15* | (2006.01) |
| *H01L 33/00* | (2010.01) |

(Continued)

(52) U.S. Cl.
CPC .............. *H01L 33/08* (2013.01); *H01L 27/153* (2013.01); *H01L 33/0079* (2013.01); *H01L 33/405* (2013.01); *H01L 33/62* (2013.01); *H01L 2224/24* (2013.01)

(58) Field of Classification Search
CPC ... H01L 33/08; H01L 27/153; H01L 2224/24; H01L 33/62; H01L 33/405; H01L 33/0079
USPC .......................................................... 438/29
See application file for complete search history.

(56) References Cited

U.S. PATENT DOCUMENTS

| | | | |
|---|---|---|---|
| 5,306,662 | A | 4/1994 | Nakamura et al. |
| 5,408,120 | A | 4/1995 | Manabe et al. |

(Continued)

FOREIGN PATENT DOCUMENTS

| | | |
|---|---|---|
| JP | 2626431 | 5/1994 |
| JP | 2681733 | 5/1994 |

(Continued)

OTHER PUBLICATIONS

International Search Report, WO2013070421, May 16, 2013, Corresponding PCT application.

(Continued)

*Primary Examiner* — Jarrett Stark
(74) *Attorney, Agent, or Firm* — Norton Rose Fulbright US LLP

(57) ABSTRACT

A light source and method for making the same are disclosed. The light source includes a conducting substrate, and a light emitting structure that is divided into segments. The light emitting structure includes a first layer of semiconductor material of a first conductivity type deposited on the substrate, an active layer overlying the first layer, and a second layer of semiconductor material of an opposite conductivity type from the first conductivity type overlying the active layer. A barrier divides the light emitting structure into first and second segments that are electrically isolated from one another. A serial connection electrode connects the first layer in the first segment to the second layer in the second segment. A power contact is electrically connected to the second layer in the first segment, and a second power contact electrically connected to the first layer in the second segment.

14 Claims, 7 Drawing Sheets

(51) Int. Cl.
*H01L 33/40* (2010.01)
*H01L 33/62* (2010.01)

(56) References Cited

U.S. PATENT DOCUMENTS

| | | |
|---|---|---|
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| RE36,747 E | 6/2000 | Manabe et al. |
| 6,215,133 B1 | 4/2001 | Nakamura et al. |
| 6,265,726 B1 | 7/2001 | Manabe et al. |
| 6,326,236 B1 | 12/2001 | Koide et al. |
| 6,420,733 B2 | 7/2002 | Koide et al. |
| 6,541,293 B2 | 4/2003 | Koide et al. |
| 6,610,995 B2 | 8/2003 | Nakamura et al. |
| 6,657,236 B1 | 12/2003 | Thibeault et al. |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,193,246 B1 | 3/2007 | Tanizawa et al. |
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,439,549 B2 | 10/2008 | Marchl et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,611,917 B2 | 11/2009 | Emerson et al. |
| 7,704,771 B2 | 4/2010 | Onushkin et al. |
| 7,709,851 B2 | 5/2010 | Bader et al. |
| 7,737,459 B2 | 6/2010 | Edmond et al. |
| 7,754,514 B2 | 7/2010 | Yajima et al. |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,910,945 B2 | 3/2011 | Donofrio et al. |
| 7,939,839 B2 | 5/2011 | Hasnain |
| 7,939,844 B2 | 5/2011 | Hahn et al. |
| 7,947,994 B2 | 5/2011 | Tanizawa et al. |
| 8,021,904 B2 | 9/2011 | Chitnis |
| 8,030,665 B2 | 10/2011 | Nagahama et al. |
| 2009/0166645 A1 | 7/2009 | Lee |
| 2012/0056193 A1 | 3/2012 | Lester et al. |
| 2012/0104424 A1 | 5/2012 | Seo et al. |

FOREIGN PATENT DOCUMENTS

| | | |
|---|---|---|
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 2735057 | 3/1996 |
| JP | 2956489 | 3/1996 |
| JP | 2666237 | 12/1996 |
| JP | 2890396 | 12/1996 |
| JP | 3250438 | 12/1996 |
| JP | 3135041 | 6/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 6/2004 |
| JP | 2008-235883 A | 10/2008 |
| JP | 2011-040425 A | 2/2011 |
| JP | 2011-181834 A | 9/2011 |
| KR | 10-0782129 B1 | 11/2007 |
| KR | 10-0966372 B1 | 5/2009 |
| KR | 10-2010-0079843 | 7/2010 |
| WO | 2010-030482 A2 | 3/2010 |
| WO | WO 2011/030252 A1 | 3/2011 |

OTHER PUBLICATIONS

Office Action issued for Korean Patent Application No. 10-2013-7032459, dated Nov. 28, 2014, 11 pages with English language translation.

Office Action issued for Japanese Patent Application No. 201-526280, dated Dec. 22, 12014, 4 pages English Language translation.

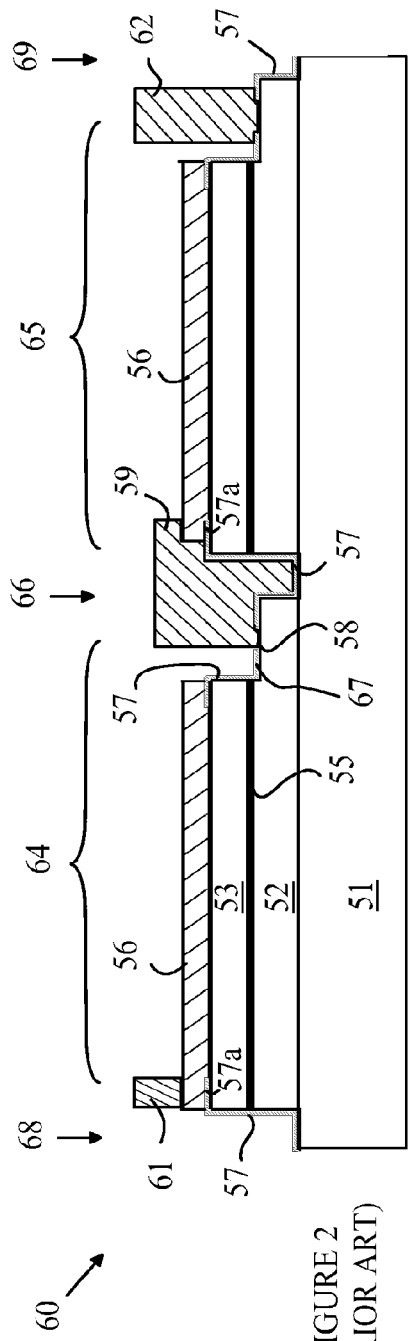
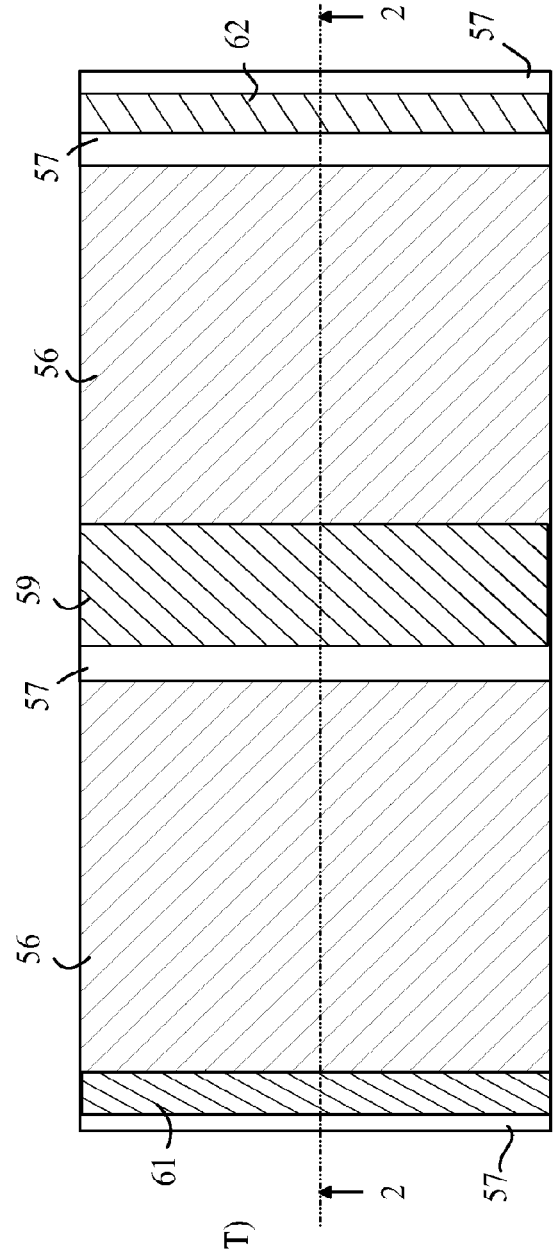
FIGURE 2 (PRIOR ART)
FIGURE 1 (PRIOR ART)

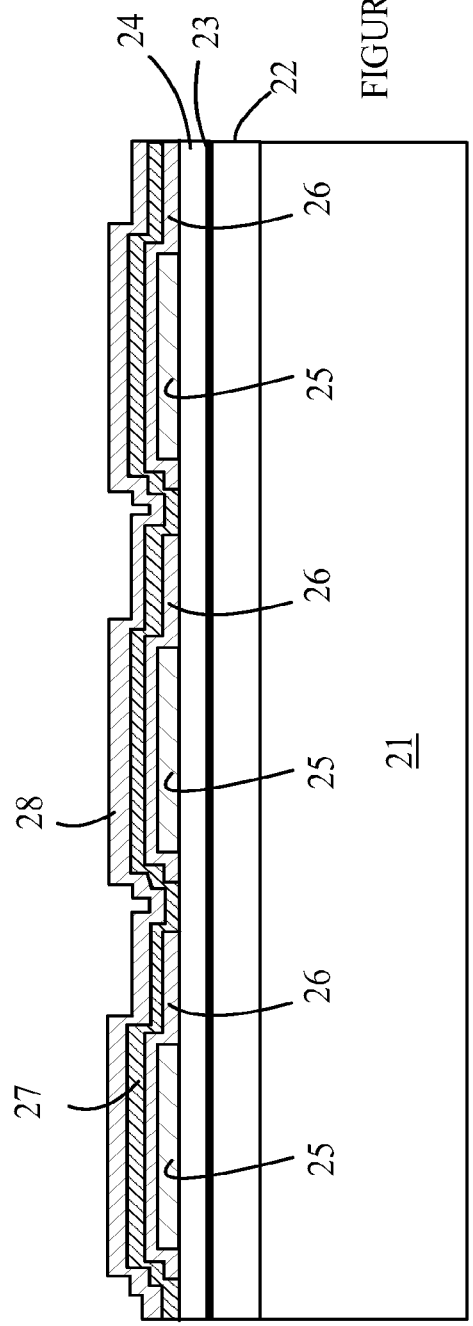

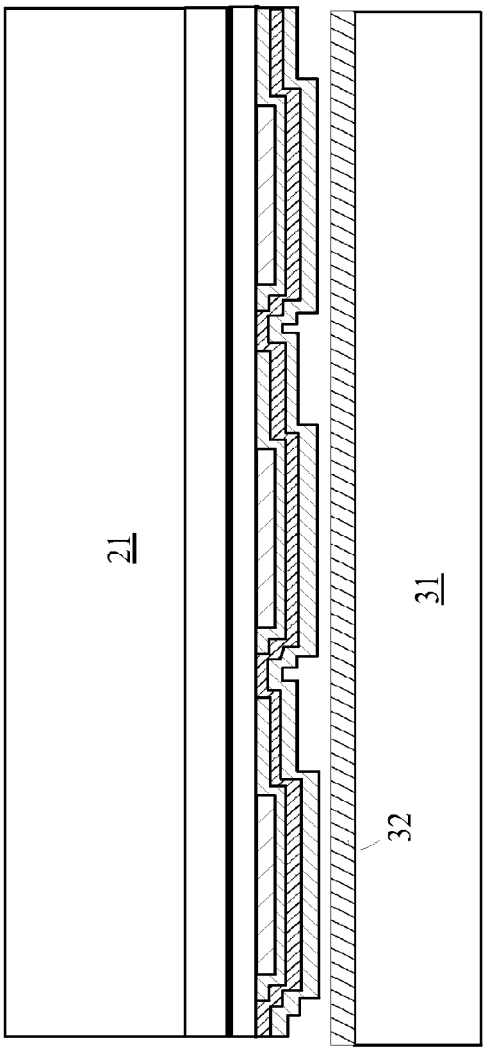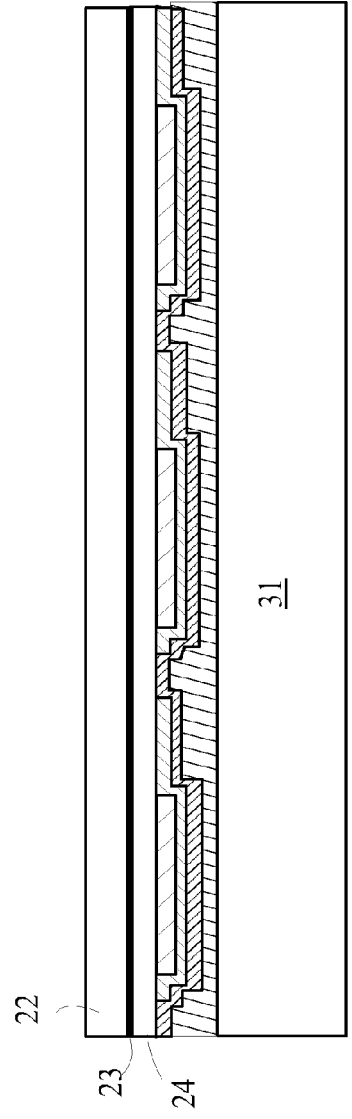
FIGURE 4
FIGURE 5

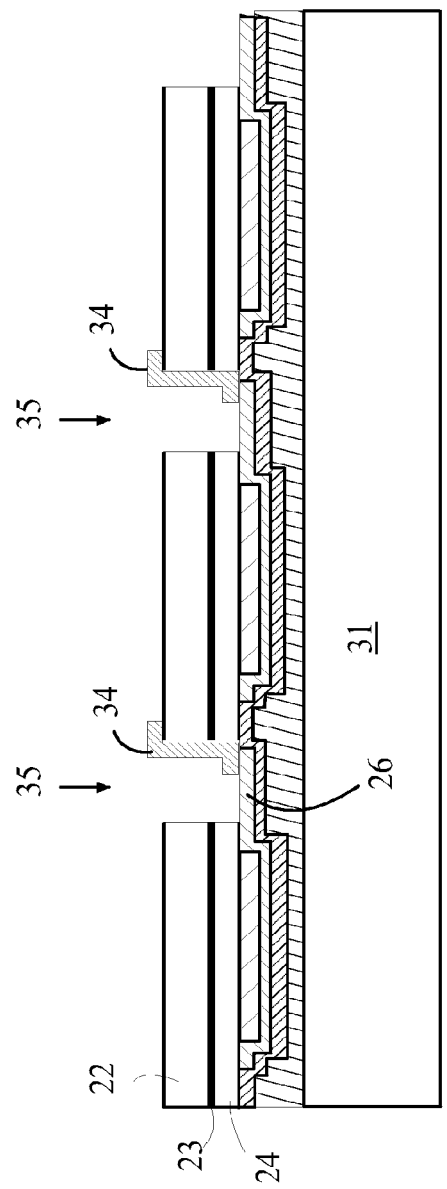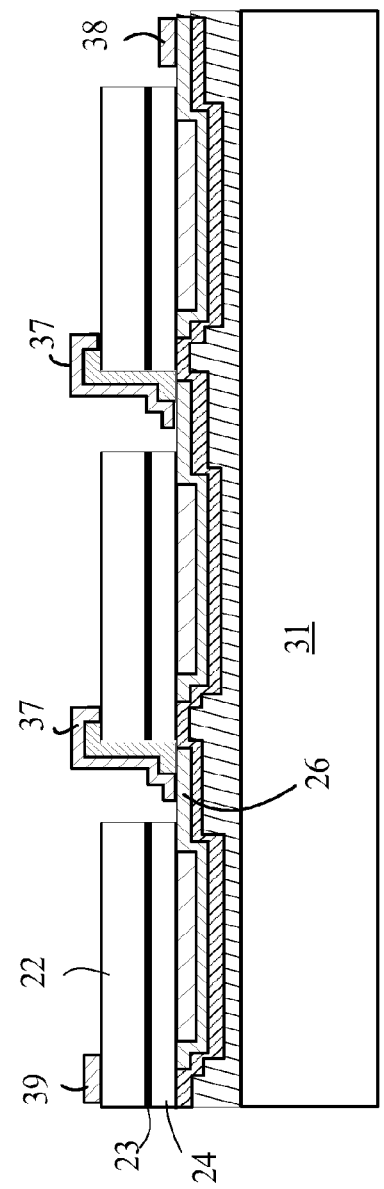

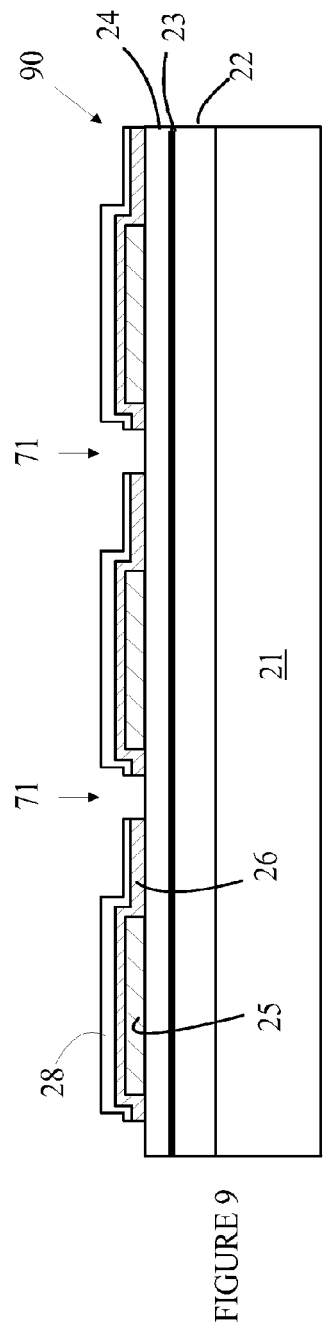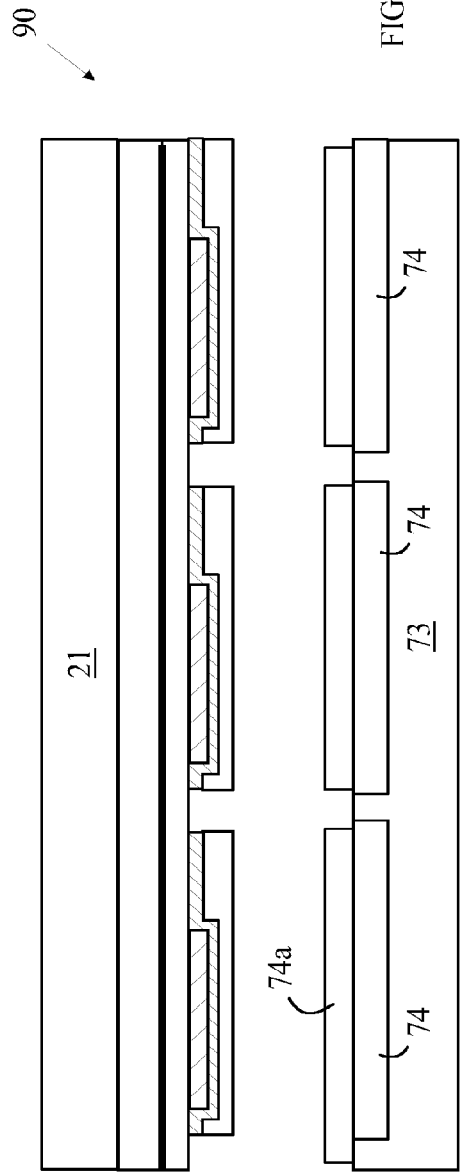

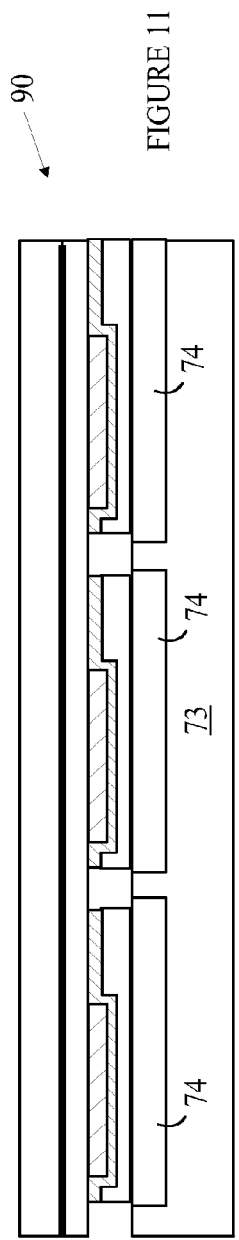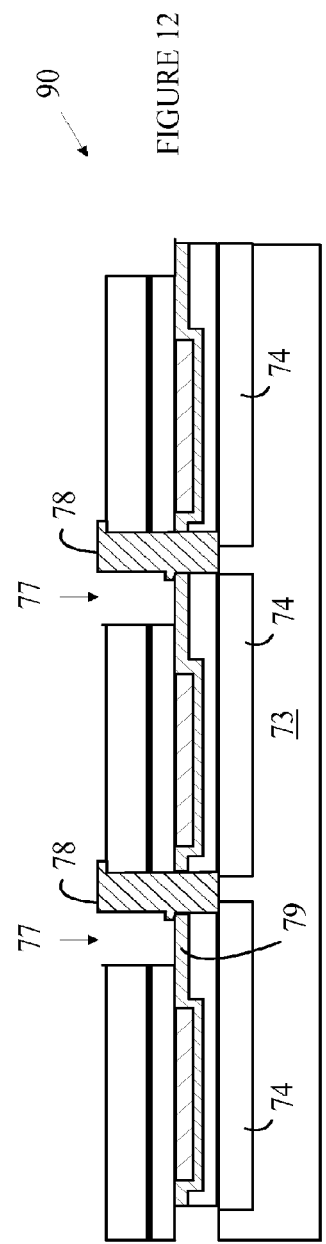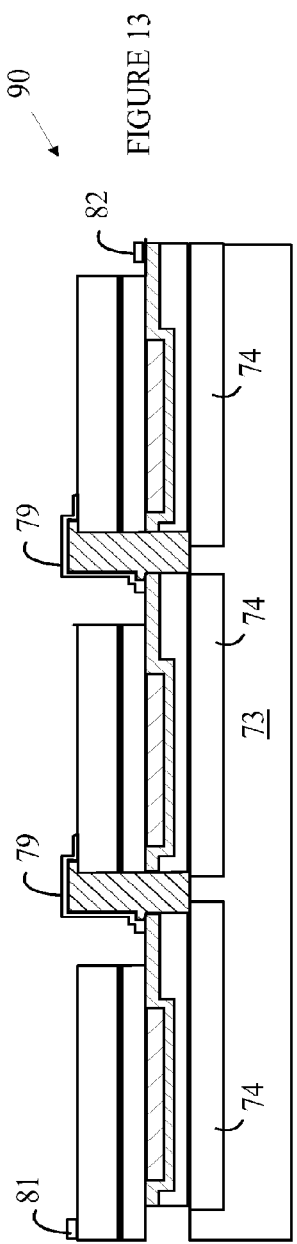

SERIES CONNECTED SEGMENTED LED

This is a Continuation of U.S. application Ser. No. 13/292,938, filed on Nov. 9, 2011, the contents of which are all herein incorporated by this reference in their entireties. All publications, patents, patent applications, databases and other references cited in this application, all related applications referenced herein, and all references cited therein, are incorporated by reference in their entirety as if restated herein full and as if each individual publication, patent, patent application, database or other reference were specifically and individual indicted to be incorporated by reference.

BACKGROUND

Light emitting diodes (LEDs) are an important class of solid-state devices that convert electric energy to light Improvements in these devices have resulted in their use in light fixtures designed to replace conventional incandescent and fluorescent light sources. The LEDs have significantly longer lifetimes and, in some cases, significantly higher efficiency for converting electric energy to light.

For the purposes of this discussion, an LED can be viewed as having three layers, the active layer sandwiched between two other layers. The active layer emits light when holes and electrons from the outer layers combine in the active layer. The holes and electrons are generated by passing a current through the LED. In one common configuration, the LED is powered through an electrode that overlies the top layer and a contact that provides an electrical connection to the bottom layer.

The cost of LEDs and the power conversion efficiency are important factors in determining the rate at which this new technology will replace conventional light sources and be utilized in high power applications. The conversion efficiency of an LED is defined to be the ratio of optical power emitted by the LED in the desired region of the optical spectrum to the electrical power dissipated by the light source. The electrical power that is dissipated depends on the conversion efficiency of the LEDs and the power lost by the circuitry that converts AC power to a DC source that can he used to directly power the LED dies. Electrical power that is not converted to light that leaves the LED is converted to heat that raises the temperature of the LED. Heat dissipation often places a limit on the power level at which an LED operates. In addition, the conversion efficiency of the LED decreases with increasing current; hence, while increasing the light output of an LED by increasing the current increases the total light output, the electrical conversion efficiency is decreased by this strategy. In addition, the lifetime of the LED is also decreased by operation at high currents. Finally, resistive losses in the conductors that route the current to the light emitting area and in the highly resistive p-layer of the LED increase rapidly with increasing current. Hence, there is an optimum current.

The driving voltage of an LED is set by the materials used to make the LED and is typically of the order of 3 volts for GaN-based LEDs. A typical light source requires multiple LEDs, as a single LED running at the optimum current does not generate enough light for many applications. The LEDs can be connected in parallel, series, or a combination of both. If the LEDs are connected in parallel, the driving voltage is low, typically of the order of 3 volts, and the current requirements are high. Hence, series connections are preferred to avoid the power losses inherent in such high current arrangements. In addition, converting the AC power source available in most applications to the DC source needed to drive the LEDs is significantly cheaper if the output driving voltage of the power supply is closer to the AC source amplitude. Accordingly, arrangements in which the LEDs are connected in series to provide a higher driving voltage for the array are preferred.

The series connections are either provided by wiring that connects the individual LEDs in the light source or by fabricating the LEDs in an array on an insulating substrate and electrically isolating each LED from the surrounding LEDs. Serial connection electrodes in this later case are then provided between the isolated LEDs by utilizing photolithographic methods. While the second method has the potential of providing reduced packaging costs, it is limited to fabrication systems in which the LED layers are grown on an insulating substrate such as sapphire so that the individual LEDs can be isolated by providing an insulating barrier such as a trench that extends down to the substrate between the individual LEDs.

There are significant cost advantages associated with fabricating LEDs on certain non-insulating substrates such as silicon wafers. Conventional fabrication lines are optimized for silicon wafers. In addition, silicon wafers are significantly cheaper than sapphire wafers. Finally, the process of singulating the individual light sources from a silicon wafer is substantially easier than the corresponding singulation process in a sapphire-based system. Accordingly, a method for generating series connected LEDs on silicon wafers or other conducting substrates is needed.

SUMMARY

The present invention includes a light source and method for making the same. The light source includes a light emitting structure that is bonded to an electrically conducting substrate. The light emitting structure includes a first layer of semiconductor material of a first conductivity type overlying the substrate, an active layer overlying the first layer, and a second layer of semiconductor material of an opposite conductivity type from the first conductivity type overlying the active layer. A barrier divides the light emitting structure into first and second segments that are electrically isolated from one another. A connection electrode connects the first layer in the first segment to the second layer in the second segment. A mirror is in electrical contact with the first layer in each of the segments, the connection electrode connecting the mirror in the first segment to the second layer in the second segment. The substrate includes first and second isolation regions that electrically isolate the mirror in the first and second segments from each other. The light source can he constructed from GaN semiconductor layers (GaN semiconductor layers include all alloys of AlInGaN) deposited on silicon substrates.

BRIEF DESCRIPTION OF THE DRAWINGS

FIG. 1 is a top view of a light source.

FIG. 2 is a cross-sectional view of the light source shown in FIG. 1.

FIGS. 3-7 illustrate the manner in which a light source according to one embodiment is fabricated.

FIGS. 9-13 illustrate the fabrication of a serially-connected light source according to another embodiment.

DETAILED DESCRIPTION

Figure 8:
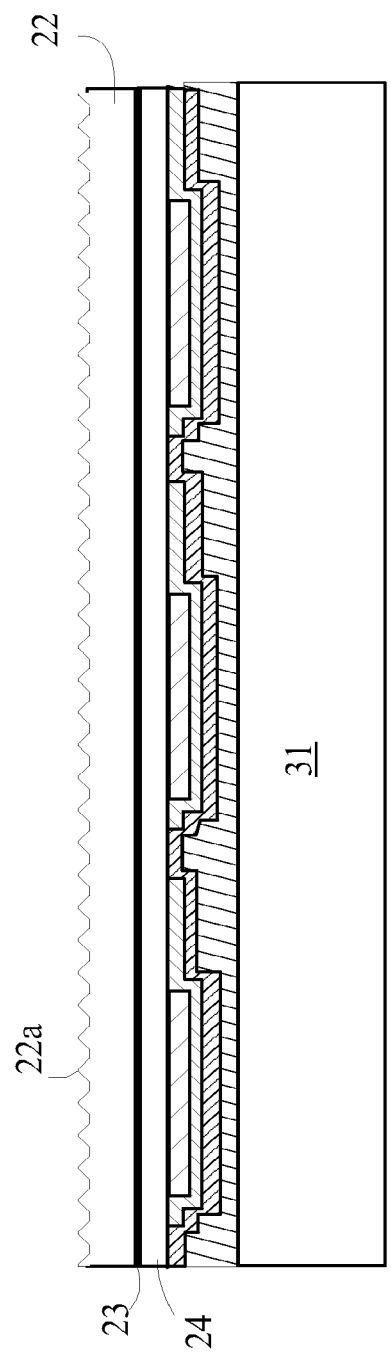
FIG. 8 illustrates an embodiment in which the exposed n-face has been etched after the growth substrate has been removed.

The manner in which the present invention provides its advantages can be more easily understood with reference to FIGS. 1 and 2, which illustrate a prior art series connected GaN-based LED light source. FIG. 1 is a top view of light source 60, and FIG. 2 is a cross-sectional view of light source 60 through line 2-2 shown in FIG. 1. Light source 60 includes two segments 64 and 65; however, it will be apparent from the following discussion that light sources having many more segments can be constructed using the same design. Light source 60 is constructed from a three-layer LED structure in which the layers are grown on a sapphire substrate 51. The n-layer 52 is grown on substrate 51, and then the active layer 55 and p-layer 53 are grown over n-layer 52. Those skilled in the art understand that these layers may be comprised of sublayers, and that in practice LEDs have many other layers. For the purpose of this patent "overlying" layers means the layers may he touching or there may be intermediate layers between them.

The segments 64 and 65 are separated by an isolation trench 66 that extends through layer 52 to substrate 51 thereby electrically isolating segments 64 and 65. Isolation trench 66 includes a plateau 67 that extends only partially into layer 52. The walls of isolation trench 66 are covered by an insulating layer 57 that includes an open area 58 for making electrical contact to the portion of layer 52 associated with each segment. Insulating layer 57 can be constructed from any material that provides an insulating layer that is free of pinhole defects. For example, SiOx or SiNx can be used as the insulating material. Other materials can include polyimide, BCB, spin-on-glass and materials that are routinely used in the semiconductor industry for device planarization.

Similar trenches are provided on the ends of light source 60 as shown at 68 and 69. A serial connection electrode 59 is deposited in isolation trench 66 such that electrode 59 makes contact with layer 52 through opening 58 in insulating layer 57. Electrode 59 also makes electrical contact with ITO layer 56 in the adjacent segment. Hence, when power is provided via electrodes 61 and 62, segments 64 and 65 are connected in series. As a result, light source 60 operates at twice the voltage and half the current of two similar LEDs connected in parallel Insulating layer 57 extends under electrodes 59 and 61 as shown at 57a in FIG. 2. Since electrode 59 is opaque, electrode 59 blocks light generated in the portion of active layer 55 immediately underlying electrode 59. In this regard, it should be noted that the thickness of the layers shown in the figures is not to scale. In practice, the thickness of layer 53 is much smaller than that of layer 52, and hence, electrode 59 blocks most of the light that is generated under electrode 59. Accordingly, current that passes through layer 55 under electrode 59 is substantially wasted, since most of the light generated by that current is lost. The insulating layer extension blocks current from flowing through this wasted area of layer 55, and hence, improves the overall efficiency of the light source. A similar issue is present under electrode 61, and hence, the insulating layer is extended under that electrode as well.

The above-described construction technique depends on substrate 51 being an insulator and providing a good etch stop during the generation of the trenches. If substrate 51 were a conducting substrate such as a silicon wafer, the two LED segments would not be isolated from one another. Hence, this technique presents challenges when the LED structure is formed on a conducting substrate. As pointed out above, there are significant advantages in utilizing a silicon substrate for forming the LED structure. The present invention provides a mechanism that allows the LED structure to form on a silicon substrate while still providing the benefits of a monolithic LED structure having a plurality of segments connected in series.

Refer now to FIGS. 3-7, which illustrate the manner in which a light source according to one embodiment of the present invention is fabricated. Refer to FIG. 3. Initially, the n-layer 22, active layer 23, and p-layer 24 are deposited on a silicon substrate 21. The substrate 21 is preferably a <111> substrate. The n-layer may include one or more buffer layers that facilitate the growth of the GaN family layers on the silicon substrate. Examples of buffer layers include AN, AlGaN, AlxGal—xN, and combinations thereof. A layer of silver-based metallization is patterned over the regions of the p-layer that are within the LEDs to provide both a mirror and a p-contact. These mirror are shown at 25. To protect the silver, a layer of a barrier metal such as platinum is deposited over the silver as shown at 26. Alternatively, barrier layers of titanium (Ti), titanium-tungsten (TiW), or titanium-tungsten-nitride (TiWN) can be used. These layers are then covered with an insulating layer 27 that includes a dielectric material. Finally, a bonding metallic layer 28 is deposited over insulating layer 27. AuSn can be utilized as the bonding material; however, other materials could also be utilized.

Refer now to FIG. 4, which illustrates the next step in the fabrication process. In this step, the wafer is inverted and positioned over a substrate 31 which is covered by a layer 32 of the bonding metal such as AuSn. Substrate 31 can be constructed from any of a number of materials; however, a second silicon substrate is preferred to facilitate the handling of the wafer in a conventional fabrication facility. To reduce cost, substrate 31 is preferably a <100> wafer. After the two structures are pressed together and bonded, wafer 21 is removed by etching, chemical mechanical planarization (CMP), grinding, or combinations thereof. Other suitable process can also be used. The wafers can be pressed together and bonded using bonding techniques that include eutectic metals. The resultant structure is shown in FIG. 5.

Refer now to FIG. 6, which illustrates the next step in the fabrication process. After substrate 21 is removed, the three LED layers are etched down to metal layer 26 as shown at 35 to form a trench that ends on metal layer 26. Etching is preferably performed using wet chemical etching with an acid such as phosphoric acid, but can also be done with other wet etchants or by ICP (inductively coupled plasma) etching, or RIE (reactive ion etching). An insulting layer is formed on one wall of the LED layer stack to protect the sidewall of the stack from contacting the serial connection electrodes that are deposited next. SiNx or SiOx are the preferred insulators for layer 34; however, other materials could be utilized provided the layers are sufficiently thick to protect the p-layer and active layer from shorting to the n-layer.

Refer now to FIG. 7, which is a cross-sectional view of the final series-connected LED light source 40. A metal layer is patterned over the structure shown in FIG. 6 to provide a plurality of series connection electrodes 37 that connect the p-layer in one LED to the n-layer in the adjacent LED. An n-contact 39 and a p-contact 38 are formed on the two end LEDs and arc used to power the light source.

It should be noted that top surface of light source 40 is the n-GaN surface with the n-face exposed. This surface is easily etched to provide scattering features that enhance the extraction of light from the LEDs. In the conventional series-connected arrangement shown above in FIGS. 1 and 2, the exposed surface is the Ga face of the p-GaN layer. The Ga face is more resistant to etching. In addition, the p-GaN layer is preferably as thin as possible to reduce the power losses in the p-GaN material, which has a significantly higher resistivity than the n-GaN material. Accordingly, this embodiment of the present invention provides additional benefits in terms of light extraction efficiency. The etching can be performed at the stage shown in FIG. 5 in which the growth substrate has been removed. Refer now to FIG. 8, which illustrates an embodiment in which the exposed n-face has been etched after the growth substrate has been removed. In this case, the top surface of layer 22 is etched to provide scattering features 22a. The scattering features preferably have dimensions that are larger than the wavelength of light generated by the LED. The remaining processing of the wafer is substantially the same as that described above with reference to FIGS. 6-7.

As noted above, heat dissipation is a consideration in LED-based light sources. Hence, substrate 31 is preferably a good heat conductor. Silicon is a good heat conductor, and hence, embodiments that utilize silicon wafers for the mounting substrate have additional advantages. The heat transfer characteristics of a light source according to the present invention can be further improved by eliminating the layer of insulator shown at 27 in the above-described embodiments. Refer now to FIGS. 9-12, which illustrate the fabrication of a serially-connected light source according to another embodiment of the present invention. The construction of light source 90 begins in a manner analogous to that discussed above, except that the insulating layer 27 is omitted. The layer of bonding metal 28 is applied directly over metal layer 26. Trench 71 is then cut down to the p-layer 24 as shown at 71 in FIG. 9.

The growth substrate is inverted and positioned relative to a second wafer 73 that is a p-type silicon wafer with a plurality of n-type wells 74 as shown in FIG. 10. Each n-type well 74 is positioned under a corresponding one of the LED segments and is covered with a layer of bonding metal 74a that is used to bond to the corresponding layer on the LED segments. The n-type wells isolate the LED segments from one another, and hence, insulating layer 27 discussed above is not needed. The two wafers are then bonded utilizing the metal layers. Finally, substrate 21 is removed leaving the structure shown in FIG. 11.

Refer now to FIG. 12. Trenches 77 are cut to divide the LED layers into a plurality of segments. The trenches extend down to the barrier metal layer 79. An insulating layer 78 is then deposited to protect the edge of each segment from the subsequent metal deposition that forms the serial connection electrodes that are shown in FIG. 13. The insulating layer can be constructed from any material that provides an insulating layer that is free of pinhole defects. For example, SiNx can be used as the insulating material. Other materials can include polyimide, BCB, and glass. Power contacts 81 and 82 are also deposited when the serial connection electrodes are formed as part of the same patterned metal deposition process.

The above-described embodiments utilize GaN semiconductor layers. However, it is to be understood that other materials could be utilized. For example, the LED layers could be constructed from other members of the GaN family of materials. For the purposes of this discussion, the GaN family of materials is defined to be all alloy compositions of GaN, InN and AlN. However, embodiments that utilize other material systems and substrates can also be constructed according to the teachings of the present invention. The present invention is particularly well suited to GaN-based LEDs on silicon substrates. It should be noted that the final mounting substrate need not be a semiconductor. For example, a metallic substrate could be utilized. Such substrates are significantly less expensive than silicon and provide significantly greater heat conductivity. The above-described embodiments utilize silicon substrates for the final device because such substrates are routinely handled in conventional semiconductor fabrication facilities while still providing good heat conduction.

The above-described embodiments have utilized a three layer LED structure. However, it is to be understood that each of these layers could include a plurality of sub-layers.

The above-described embodiments of the present invention have been provided to illustrate various aspects of the present invention. However, it is to be understood that different aspects of the present invention that are shown in different specific embodiments can be combined to provide other embodiments of the present invention. In addition, various modifications to the present invention will become apparent to those skilled in the art from the foregoing description and accompanying drawings. Accordingly, the present invention is to be limited solely by the scope of the following claims.

What is claimed is:

1. A method of fabricating a light emitting device, comprising:
    depositing a light emitting structure on a first substrate, the light emitting structure comprising:
        a first semiconductor layer formed on the first substrate,
        an active layer formed on the first semiconductor layer, and
        a second semiconductor layer formed on the active layer;
    patterning a metallic mirror layer over the second semiconductor layer and in electrical contact therewith;
    forming a barrier layer directly on the mirror layer and directly on the second semiconductor layer;
    forming a metallic bonding layer above the barrier layer;
    bonding the metallic bonding layer to a second substrate, wherein the second substrate comprises:
        a region of a first conductivity type,
        a first isolation region of a second conductivity type, and
        a second isolation region of the second conductivity type;
    removing the first substrate;
    etching the light emitting structure to form a trench that exposes an upper surface of the barrier layer, wherein the trench divides the light emitting structure into first and second segments that are electrically isolated from one another at least by the first and second isolation regions; and
    forming a connection electrode that contacts at least a portion of an upper surface of the barrier layer in the first segment and connects the barrier layer in the first segment to the first semiconductor layer in the second segment.

2. The method of claim 1, further comprising:
    depositing a first power contact electrically connected to the second semiconductor layer in the first segment; and
    depositing a second power contact electrically connected to the first semiconductor layer in the second segment, wherein the first and second segments generate light when a potential difference is created between the first and second power contacts.

3. The method of claim 1, wherein the first and second isolation regions isolate the mirror from the second substrate.

4. The method of claim 1, wherein the first substrate comprises silicon.

5. The method of claim 1, wherein the second substrate comprises silicon.

6. The method of claim 1, wherein the first semiconductor layer comprises an n-type GaN family member.

7. The method of claim 1 wherein the metallic bonding layer is formed directly on the barrier layer.

8. The method of claim 1 wherein the second substrate is a p-type substrate, and wherein the first and second isolation regions are n-type wells.

9. The method of claim 1, wherein the first isolation region is positioned with correspondence to the first segment, and the second isolation region is positioned with correspondence to the second segment.

10. The method of claim 9 further comprising:
forming a second metallic bonding layer over the first isolation region and the second isolation region prior to the bonding step, wherein the second metallic bonding layer over the first isolation region is used to bond the first isolation region to the corresponding first segment, and the second metallic bonding layer over the second isolation region is used to bond the second isolation region to the corresponding second segment.

11. The method of claim 10 wherein the second metallic bonding layer formed over the first isolation region is isolated from the second metallic bonding layer formed over the second isolation region.

12. The method of claim 1 further comprising:
forming an insulation layer in at least a portion of the trench, wherein the connection electrode is formed on at least a portion of the insulation layer.

13. The method of claim 12 wherein the insulation layer is formed from silicon nitride.

14. The method of claim 1 wherein the first conductivity type is a p-type, and the second conductivity type is n-type.

* * * * *

UNITED STATES PATENT AND TRADEMARK OFFICE
CERTIFICATE OF CORRECTION

PATENT NO.            : 9,123,853 B2  
APPLICATION NO.       : 13/959313  
DATED                 : September 1, 2015  
INVENTOR(S)           : Steven D. Lester et al.

Page 1 of 1

It is certified that error appears in the above-identified patent and that said Letters Patent is hereby corrected as shown below:

In the Specification:  
    At column 1, line number 11, delete "individual" and replace with --individually--.  
    At column 1, line number 12, delete "indicted" and replace with --indicated--.  
    At column 1, line number 17, delete "light Improvements" and replace with --light. Improvements--.  
    At column 1, line number 41, delete "he" and replace with --be--.  
    At column 2, line number 46, delete "he" and replace with --be--.  
    At column 3, line number 15, delete "he" and replace with --be--.  
    At column 4, line number 8, delete "AN" and replace with --AlN--.  
    At column 4, line number 55, delete "arc" and replace with --are--.  
    At column 5, line number 17, delete "he" and replace with --be--.  
    At column 5, line number 45, delete "he" and replace with --be--.  
    At column 5, line number 60, delete "he" and replace with --be--.

Signed and Sealed this  
Twelfth Day of January, 2016

Michelle K. Lee  
*Director of the United States Patent and Trademark Office*